United States Patent
Koh et al.

(10) Patent No.: US 10,649,156 B2
(45) Date of Patent: May 12, 2020

(54) OPTICAL SENSING DEVICE HAVING INTEGRATED OPTICS AND METHODS OF MANUFACTURING THE SAME

(71) Applicant: Avago Technologies International Sales Pte. Limited, Singapore (SG)

(72) Inventors: Gim Hong Koh, Singapore (SG); Ramana Murty, San Jose, CA (US); Ching Kean Chia, Singapore (SG)

(73) Assignee: Avago Technologies International Sales Pte. Limited, Singapore (SG)

( * ) Notice: Subject to any disclaimer, the term of this patent is extended or adjusted under 35 U.S.C. 154(b) by 442 days.

(21) Appl. No.: 15/389,934

(22) Filed: Dec. 23, 2016

(65) Prior Publication Data
US 2018/0182906 A1    Jun. 28, 2018

(51) Int. Cl.
| | |
|---|---|
| *H01L 31/0232* | (2014.01) |
| *G02B 6/42* | (2006.01) |
| *H01L 31/02* | (2006.01) |
| *H04B 10/40* | (2013.01) |
| *H01L 31/0203* | (2014.01) |

(52) U.S. Cl.
CPC ........ *G02B 6/4206* (2013.01); *H01L 31/0203* (2013.01); *H01L 31/02327* (2013.01)

(58) Field of Classification Search
CPC .. G02B 6/4206; G02B 6/4201; G02B 6/4204; G02B 6/4219; G02B 6/4295; G02B 19/0076; G02B 19/0085; H01L 31/0203; H01L 31/0232; H01L 31/02327; G01J 1/0403; G01J 1/0407; G01J 1/0422
See application file for complete search history.

(56) References Cited

U.S. PATENT DOCUMENTS

| | | | | |
|---|---|---|---|---|
| 6,653,551 | B2 * | 11/2003 | Chen | H01L 31/0543 136/246 |
| 8,168,991 | B2 * | 5/2012 | Krauter | G02B 1/105 257/98 |
| 8,564,012 | B2 * | 10/2013 | Ankireddi | G01S 17/026 257/100 |
| 8,934,745 | B2 * | 1/2015 | Mathai | G02B 6/4228 385/14 |
| 2004/0009622 | A1 * | 1/2004 | Moon | G01J 1/06 438/48 |
| 2006/0006319 | A1 * | 1/2006 | Bechtel | B60R 1/088 250/239 |

(Continued)

OTHER PUBLICATIONS

Nussbaum et al., "Design, fabrication and testing of microlens arrrays for sensors and microsystems," Pure Appl. Opt. 6, Aug. 8, 1997, 20 pages.

(Continued)

*Primary Examiner* — John R Lee
(74) *Attorney, Agent, or Firm* — Sheridan Ross P.C.

(57) ABSTRACT

The present disclosure provides a communication system, a sensing device, and a semiconductor device, among other things. One example of the disclosed sensing device includes a semiconductor die having a photodetector, an optical element optically coupled to and disposed on the photodetector, at least one support structure substantially surrounding the optical element, and a top metal portion disposed on the semiconductor die adjacent to but distanced away from the optical element and the at least one support structure.

20 Claims, 12 Drawing Sheets

(56) References Cited

U.S. PATENT DOCUMENTS

| | | | |
|---|---|---|---|
| 2006/0072222 A1* | 4/2006 | Lichy | G01J 1/04 359/853 |
| 2006/0076636 A1* | 4/2006 | Fukunaga | H01L 27/14625 257/432 |
| 2006/0220073 A1* | 10/2006 | Kooriyama | H01L 27/1462 257/257 |
| 2010/0155763 A1* | 6/2010 | Donofrio | H01L 33/50 257/98 |
| 2010/0240168 A1* | 9/2010 | Tseng | H01L 27/1462 438/65 |
| 2010/0308427 A1* | 12/2010 | Lenchenkov | H01L 27/14625 257/432 |
| 2012/0091551 A1* | 4/2012 | Marenco | H01L 27/14625 257/432 |
| 2013/0001409 A1* | 1/2013 | Tsukagoshi | H01L 31/0203 250/226 |
| 2013/0341650 A1* | 12/2013 | Peng | H01L 23/31 257/82 |
| 2014/0026959 A1* | 1/2014 | Schilling | H01L 31/048 136/259 |
| 2014/0145069 A1* | 5/2014 | Earman | H03K 17/941 250/214 SW |
| 2014/0338748 A1* | 11/2014 | Matano | G02B 19/0042 136/259 |
| 2014/0367816 A1* | 12/2014 | Murty | H01L 31/02327 257/432 |
| 2015/0034804 A1* | 2/2015 | Lee | G01J 1/0411 250/208.2 |
| 2015/0117824 A1* | 4/2015 | Wang | G02B 6/32 385/93 |
| 2015/0171131 A1* | 6/2015 | Abe | H01L 23/544 257/432 |
| 2015/0243859 A1* | 8/2015 | Schmidtke | H01L 33/56 257/98 |
| 2016/0111611 A1* | 4/2016 | Yoshida | C08K 3/013 257/98 |
| 2016/0155883 A1* | 6/2016 | Shi | H01L 31/024 257/186 |
| 2016/0170296 A1* | 6/2016 | Wang | H01L 31/02327 430/5 |
| 2016/0231471 A1* | 8/2016 | Ma | G02B 3/0037 |
| 2017/0104140 A1* | 4/2017 | Gaska | H01L 33/56 |
| 2017/0294560 A1* | 10/2017 | Ho | H01L 33/56 |
| 2018/0108797 A1* | 4/2018 | Huang | H01L 31/0543 |
| 2018/0182906 A1* | 6/2018 | Koh | G02B 6/4295 |
| 2018/0323320 A1* | 11/2018 | Mehrl | H01L 27/14685 |

OTHER PUBLICATIONS

Shen et al., "Rapid fabrication of a micro-ball lens array by extrusion for optical fiber applications," Optics Express, Jul. 20, 2009, vol. 17, No. 15, 6 pages.

Pan et al., "Optical Techniques for Fabrication of Microball Lens Arrays," 7 pages.

* cited by examiner

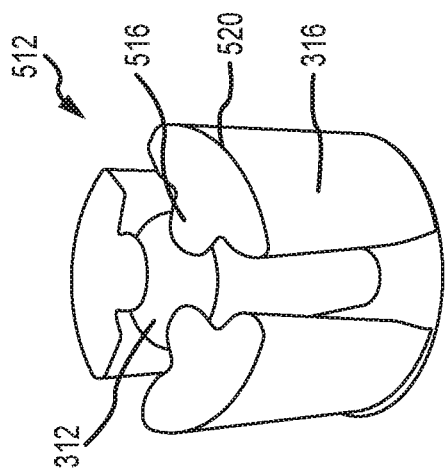
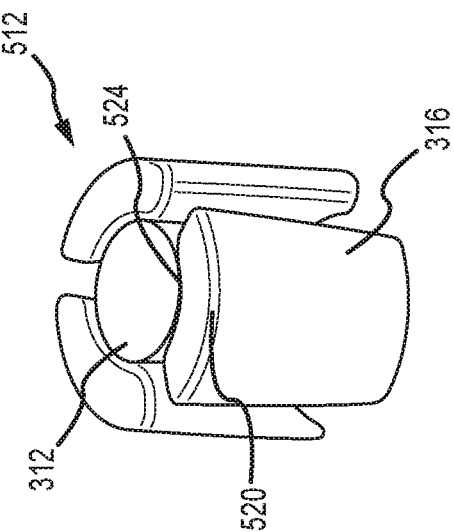
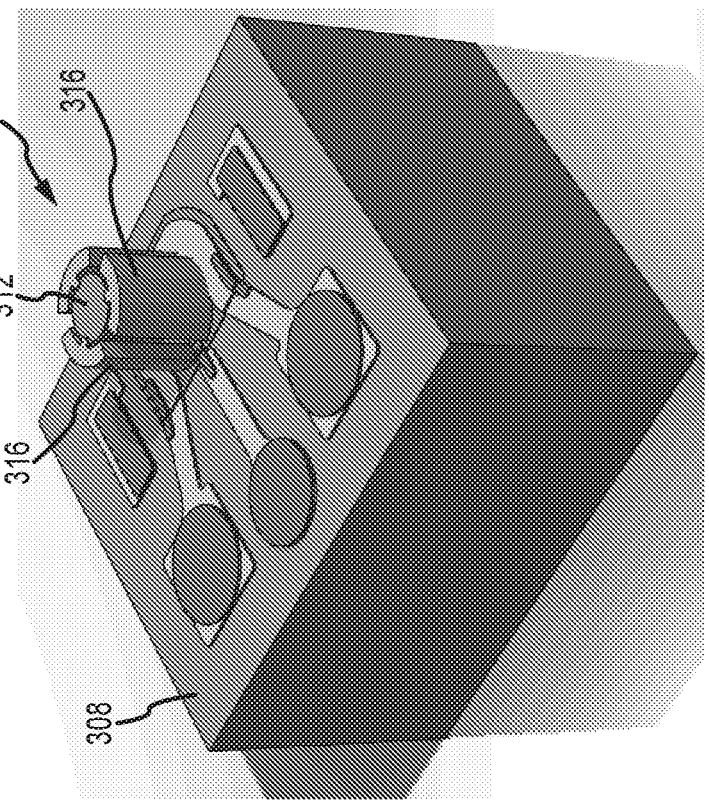

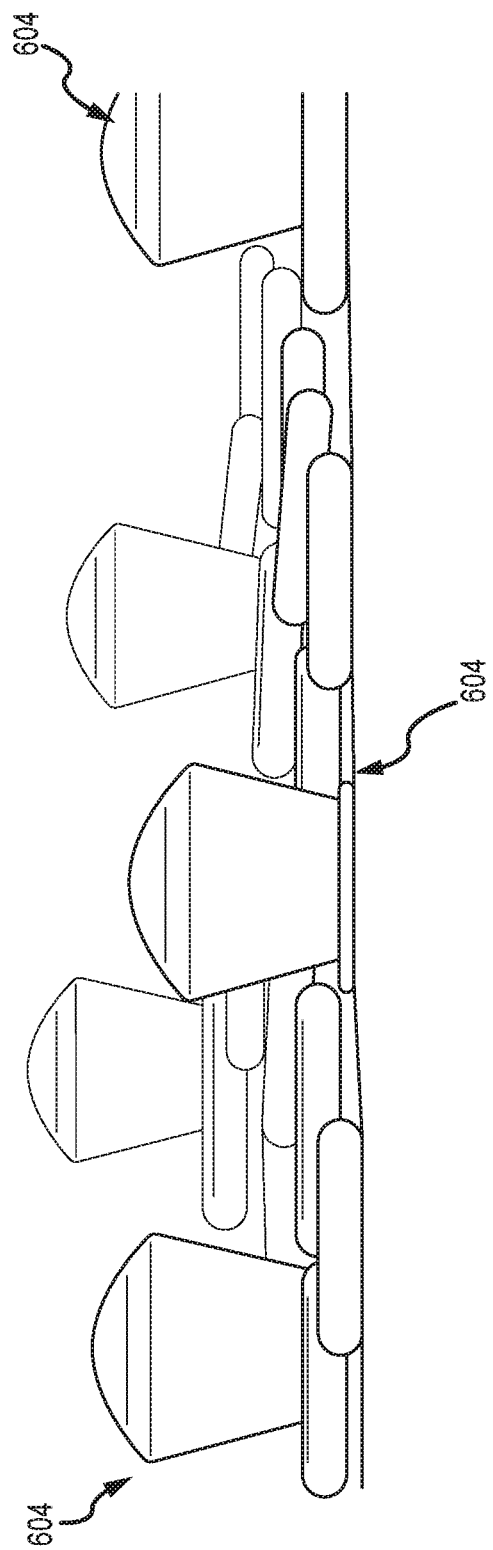

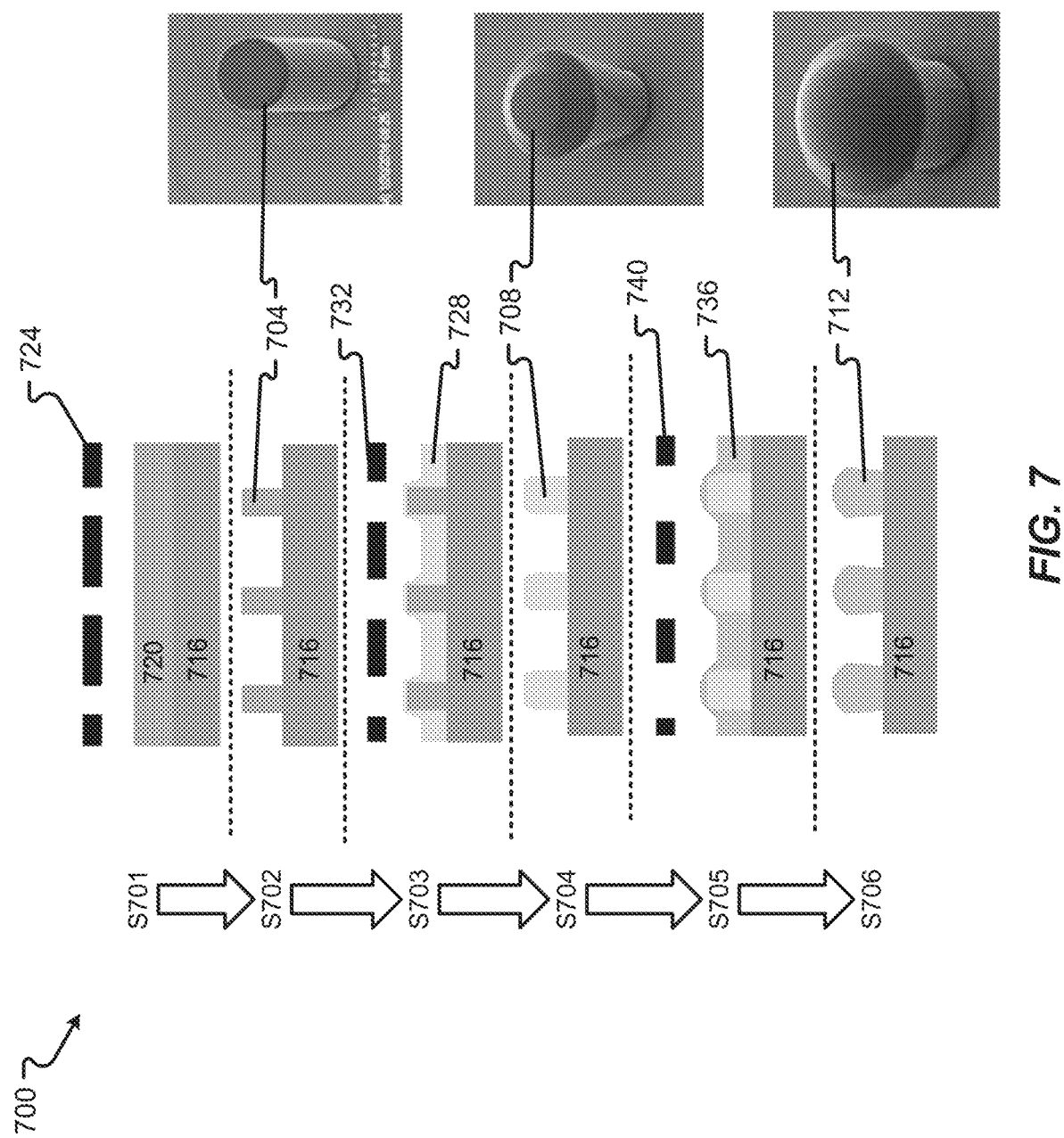

OPTICAL SENSING DEVICE HAVING INTEGRATED OPTICS AND METHODS OF MANUFACTURING THE SAME

FIELD OF THE DISCLOSURE

The present disclosure is generally directed toward optical devices and optical systems that employ the same.

BACKGROUND

Semiconductor photodetectors, such as P-I-N diode photodetectors, require a low capacitance for certain applications. The requirement for a low capacitance imposes a requirement for a small aperture size. For instance, if the capacitance of the photodetector is required to be under 100 fF, it is common that the corresponding aperture size will need to be around or lower than 30 um in diameter. Requiring a small area of light detection inflicts challenges for optical alignment and optical tolerances—especially in optical communication systems that utilize optical fibers.

BRIEF DESCRIPTION OF THE DRAWINGS

The present disclosure is described in conjunction with the appended figures:

FIG. 5C is an isometric view of an optical sensing device at a third step of manufacture in accordance with at least some embodiments of the present disclosure;

FIG. 5D is an isometric view of a first illustrative light guide system for use with an optical sensing device as depicted in FIG. 5C;

FIG. 5E is an isometric view of a second illustrative light guide system for use with an optical sensing device as depicted in FIG. 5C;

FIG. 6B is an isometric view of an array of optical sensing devices during chip-scale manufacturing in accordance with at least some embodiments of the present disclosure;

FIG. 7 is a flow diagram depicting a series of steps used in a first method of manufacturing an optical sensing device in accordance with at least some embodiments of the present disclosure;

DETAILED DESCRIPTION

Figure 1A:
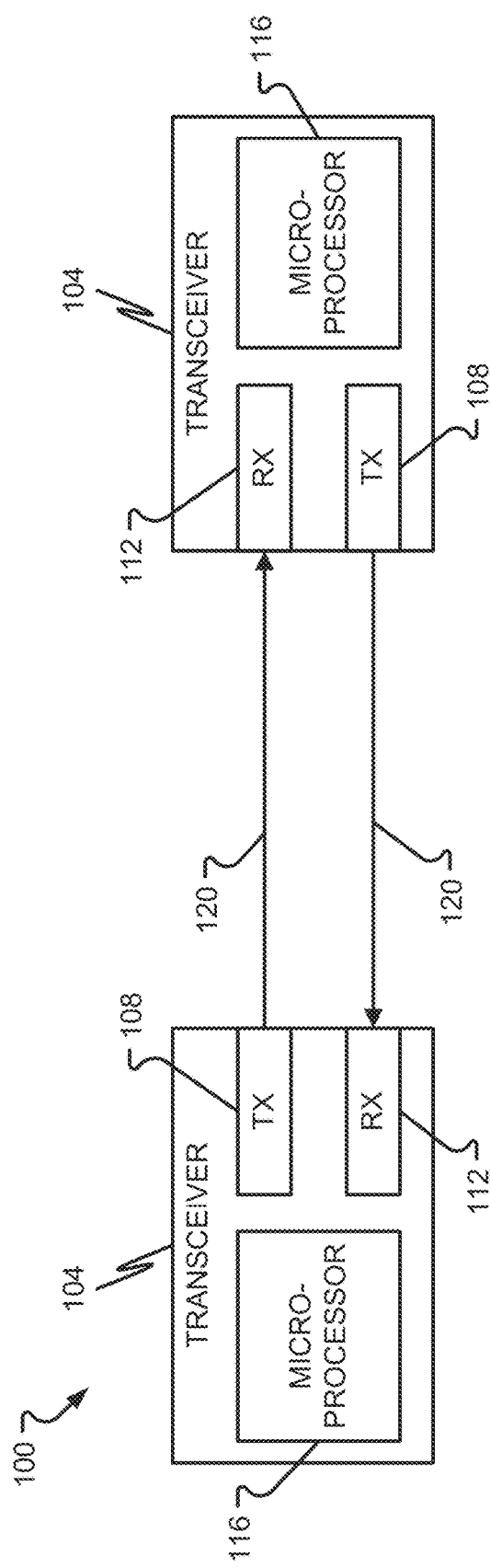
FIG. 1A is a block diagram depicting an optical communication system in accordance with at least some embodiments of the present disclosure.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, components, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another—although some features or elements may exhibit discrete changes as well. Thus, the elements illustrated in the drawings are schematic in nature and their shapes are not intended to be limited to the precise shape of an element and are not intended to limit the scope of the present disclosure.

It will be understood that when an element such as a region, component, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

It is with respect to the above-noted shortcomings of the prior art that the features disclosed herein were contemplated. In particular, solutions are proposed to provide an optical sensing device with an optical element that is supported by a support structure, which may be separate from the optical element or integral with the optical element. One aspect of the present disclosure is to utilize a support structure that otherwise supports and compensates for the optical element's inability to reliably support itself. In some embodiments, the optical element and support structure are manufactured at the wafer-scale. As such, the optical element and support structure may be manufactured as micromechanical elements on a semiconductor chip having a photosensitive area.

With reference now to FIGS. 1-10, various configurations of an optical sensing device, systems in which an optical sensing device can be utilized, and methods for manufacturing an optical sensing device will be described. It should be appreciated that the various manufacturing methods can be used to produce any of the optical sensing devices depicted and described herein. Furthermore, features described in connection with an optical sensing device of one configuration may be provided as part of any one of the optical sensing devices depicted and described herein. As an example, the features of the optical sensing device depicted in FIG. 2 can be incorporated into the optical sensing device depicted in FIG. 10 without departing from the scope of the present disclosure—and vice versa.

Figure 1B:
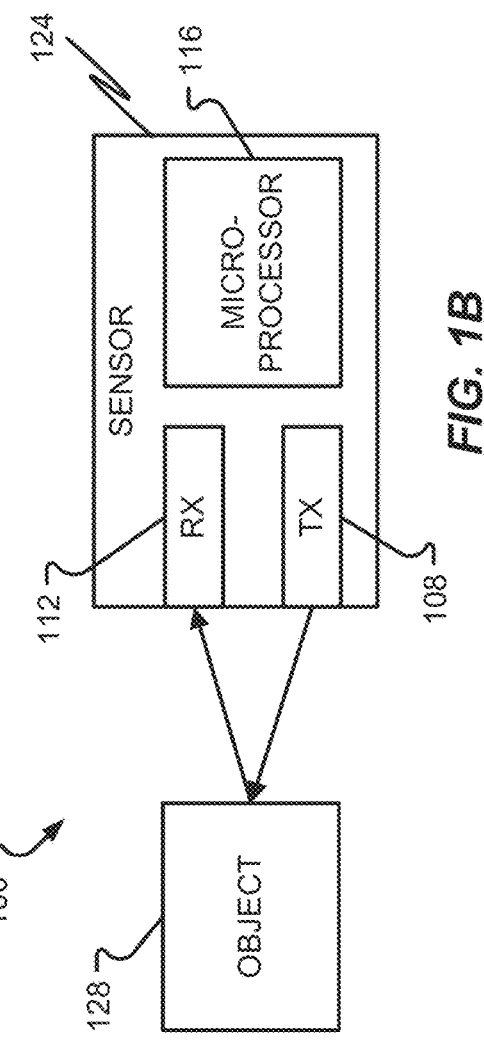
FIG. 1B is a block diagram depicting an optical sensing system in accordance with at least some embodiments of the present disclosure.

Referring initially to FIGS. 1A and 1B, optical systems 100 in which an optical sensing device can be utilized will be described in accordance with at least some embodiments of the present disclosure. FIG. 1A, for instance, depicts an optical system 100 in which transceivers 104 are enabled to communicate with one another using light signals 120. In some embodiments, a transceiver 104 may include a receiver function 112 and a transmitter function 108. The transmitter and receiver functions 108, 112 may be operated or driven by a microprocessor 116 of the transceiver 104.

The transmitter function 108 may be responsible for generating a wireless communication signal, such as a light signal 120. The light signal 120 may be modulated, encoded, or otherwise manipulated to communicate information across a communication medium, such as air, an optical fiber, or the like. In some embodiments, the light signal 120 comprises a collimated beam of light that is transmitted over an optical fiber and the optical fiber may be physically connected to both the transmitter function 108 and the receiver function 112. The light signal 120 may travel a relatively long distance (e.g., on the order of miles) or a relatively short distance (e.g., on the order of one to ten feet) before reaching the receiver function 112. The receiver function 112 may include an optical sensing device as will be described in further detail herein. Specifically, the receiver function 112 may comprise hardware components or equipment that enable the receiver function 112 to convert the light signal 120 into an electrical signal that is capable of being processed by the microprocessor 116. The microprocessor 116 may comprise circuitry or logic that enables the electrical signal to be demodulated, decoded, or otherwise reformatted such that information can be extracted therefrom.

As with most traditional communication systems, the transceiver 104 may be configured to send light signals 120 via the transmitter function 108 and simultaneously receive light signals 120 via the receiver function 112. While the transmitter function 108 and receiver function 112 are depicted as being included in a transceiver 104, it should be appreciated that such a configuration is not required. To the contrary, the optical system 100 may comprise a dedicated transmitter and receiver, rather than incorporating both functions into a transceiver 104 as depicted.

FIG. 1B shows another example of an optical system 100 that may utilize an optical sensing device in accordance with at least some embodiments of the present disclosure. Rather than the optical communication system of FIG. 1A, FIG. 1B depicts an optical sensing system capable of detecting an object 128 in proximity of an optical sensor 124. The optical sensor 124 is similar to the transceiver 104 in that the optical sensor 124 is shown to include both a transmitter function 108 and a receiver function 112. The optical sensor 124 may be configured to transmit light via its transmitter function 108 and the light may reflect off an object 128. The reflected light may then be detected or sensed by the receiver function 112, which may include an optical sensing device as will be described in further detail herein. Based on the intensity/amount of light detected at the receiver function 112, the proximity of the object 128 relative to the sensor 124 can be determined. As can be appreciated, the light transmitted by the transmitter function 108 may travel over air, gas, or some other unconstrained communication medium, which means that the light detected at the receiver function 112 may not necessarily be collimated as with the communication system that employs optical fibers to carry the light signal 120 between the transmitter function 108 and receiver function 112.

It should be appreciated that the light emitted by the transmitter function 108 and received at the receiver function 112 may have any wavelength. Non-limiting examples of the types of light that may be emitted by the transmitter function 108 and received at the receiver function 112 include infrared light, visible light, ultraviolet light, etc. Said another way, the light travelling between the transmitter function 108 and receiver function 112 may correspond to electromagnetic radiation of any wavelength.

Figure 2:
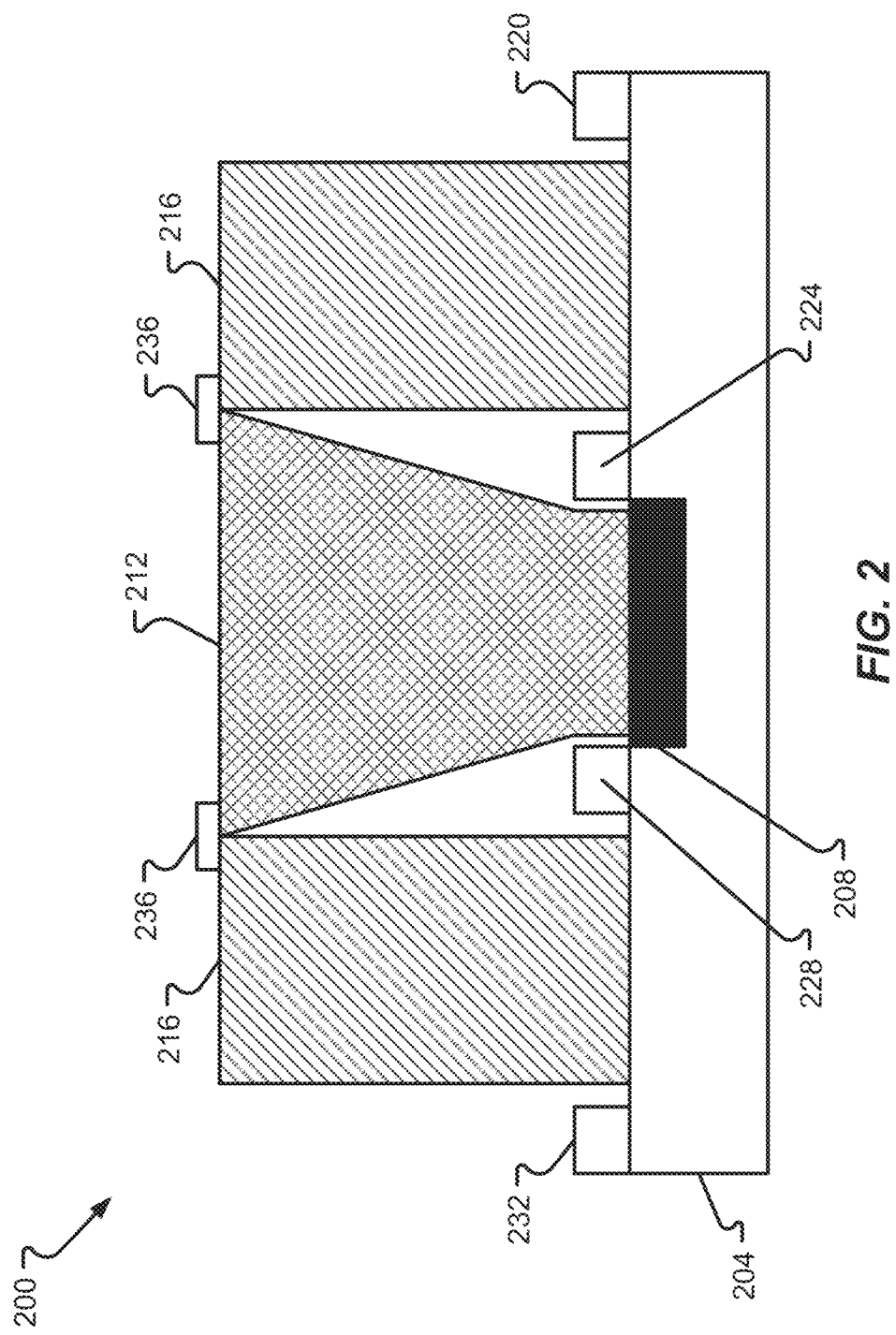
FIG. 2 is a block diagram depicting an illustrative optical sensing device in accordance with at least some embodiments of the present disclosure.
Figure 3:
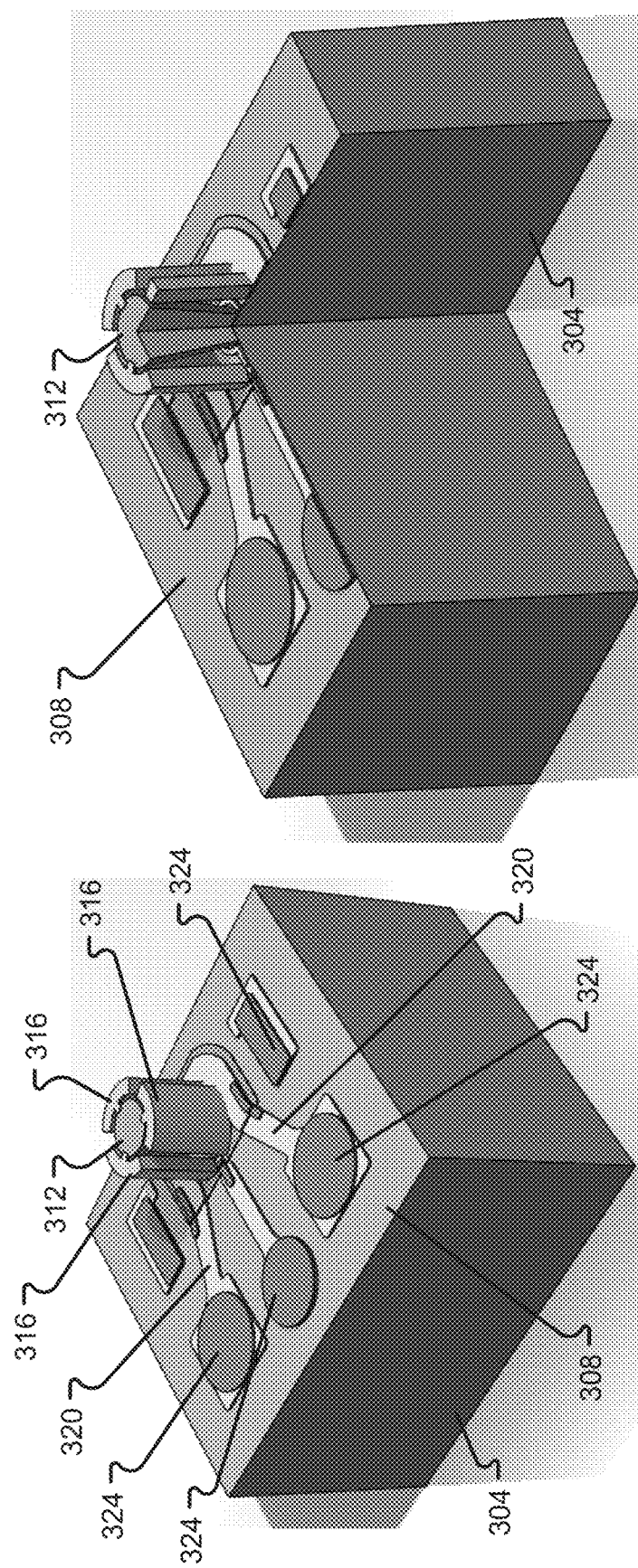
FIG. 3A is an isometric view of an optical sensing device in accordance with at least some embodiments of the present disclosure.
FIG. 3B is a cross-sectional isometric view of the optical sensing device of FIG. 3A.

With reference now to FIG. 2, additional details of an optical sensing device 200 that maybe used in an optical system 100 will be described in accordance with at least some embodiments of the present disclosure. The optical sensing device 200 is shown to include a substrate 204 having a photodetector 208 on a top surface thereof. The substrate 204 may correspond to a semiconductor die or the like. The substrate 204 physically supports an optical element 212 as well as one or more support structures 216. Both the optical element 212 and support structure(s) 216 may be formed directly on a top surface of the substrate 204 using semiconductor manufacturing techniques. As shown in the block diagram illustrated in FIG. 2, the optical element 212 may be substantially optically isolated from the support structure(s) by way of minimizing the physical contact. For example, the optical element 212 may be physically in contact with the support structure(s) 216 through an outer perimeter of the optical element 212. The materials used for the optical element 212 may be similar or identical to the materials used for the support structure(s) 216. It may also be possible to form the optical element 212 and support structure(s) 216 simultaneously on top of the substrate 204. The optical element 212 and the support structure(s) 216 may be integrally formed. For example, the optical element 212 and the support structure(s) 216 may be formed as a single piece of a substantially transparent material.

The optical sensing device 200 is further shown to include a plurality of metal formations on the top surface of the substrate 204. In particular, metal pads 220, 232 and metal traces 224, 228 may be formed on the top surface of the substrate 204. As a non-limiting example, the top metal pads 220, 232 may correspond to contact pads that facilitate wirebonding to external electrical devices (e.g., a microprocessor 116, a Printed Circuit Board (PCB), or the like). The metal traces 224, 228 may also be formed on the top surface of the substrate 204 to carry electrical current between the top metal pads 220, 232 or other electrical components on the substrate 204. In some embodiments, the top metal traces 224, 228 may be combined as a single trace. At least some of the traces 224, 228 may be used to form a ring or similar structure that surrounds, encircles, etc. the photodetector 208.

The photodetector 208 may correspond to a light sensitive area established on the top surface of the substrate 204. In some embodiments, the photodetector 208 may have a top surface that is substantially co-planar or coincident with the top surface of the substrate 204. The photodetector 208 may be photodiodes that correspond to an n-doped or p-doped region of the substrate 204. A corresponding and oppositely doped region in the substrate 204 may also be provided (e.g., a p-doped or n-doped region) underneath the photosensitive area of the photodetector 208. This opposite doping may enable the photodetector 208 to convert photons or light energy into electrons or electrical current. As a more specific but non-limiting example, the photodetector 208 and its interface to the substrate 204 may correspond to a P-I-N diode that is capable of sensing light received at the optical element and converting the light into an electrical signal having a current that represents the amount of light energy received at the photodetector. As another example, the photodetector 208 may be photo-transistors.

The optical element 212 is shown as having a particular geometry or shape that enables light to be collected over an area larger than the photodetector's 208 area. Said another way, the optical element 212 may have a light-receiving surface that has a larger area than the area that interfaces with the photodetector 208. The optical element 212 may be configured to direct or transmit light to the photodetetor 208. In some embodiments, the optical element 212 may have a flat top surface, but in another embodiment, the optical element may comprise a lens with a convex top surface. This geometry of the optical element 212 helps to increase the amount of light collected for and provided to the photodetector 208, which helps to improve the overall performance of the optical sensing device 200. Unfortunately, the depicted geometry of the optical element 212 may not be as structurally reliable as a traditional cylindrical geometry. Thus, while the geometry of the optical element 212 may help to improve the optical performance of the optical sensing device 200, the geometry of the optical element 212 may be susceptible to mechanical failure without additional physical/structural support from the support structure(s) 216.

Accordingly, the support structure(s) 216 are provided around the optical element 212 to physically contact the optical element 212 and support the optical element 212. In other words, the support structure(s) 216 provide a mechanical support for the optical element 212. One design consideration for the support structure(s) 216 is that the interface between the support structure(s) 216 and optical element 212 may introduce areas for light/signal losses or noise. Accordingly, it may be desirable to minimize the physical interface between the components 212, 216 in such a way that the desired mechanical support is provided but the undesired light losses are not unduly impactful.

In the depicted embodiment, the support structure(s) 216 are shown to be structurally independent from the optical element 212 and are shown to have a sturdy structural design (e.g., substantially vertical side walls). As will be discussed in further detail herein, the support structure(s) 216 may have various configurations and may be integral to the optical element 212 rather than being separate from the optical element 212 as shown in FIG. 2. The support structure(s) 216 are further shown to have a height approximately equal to a height of the optical element 212. One or more overhang portions 236 may be used to provide a further mechanical interface between the optical element 212 and the support structure(s) 216. In some embodiments, the overhang portion 236 may correspond to a separate structural element that is built on top of the optical element 212 and support structure(s) 216. In other embodiments, the overhang portions 236 may be integral parts of the support structure(s) 216 and/or the optical element 212. In some embodiments, the overhang portions 236 are no larger than 20% of the overall light-receiving surface of the optical element 212.

As will be discussed in further detail herein, the optical element 212 may operate as a light guide to direct light towards the photodetector 208, lens, or the like that facilitates the efficient transmission of light energy from its light-receiving surface (e.g., the top surface of the optical element 212) to the photodetector 208. The effective area covered by the light-receiving surface of the optical element 212 is larger than the effective area of the photodetector 208. This light-guiding functionality dictates that the optical element 212 be made of or manufactured by an optically transparent material. In some embodiments, the optical element 212 is formed on the photodetector 208 at the wafer level. The optical element 212 may be formed using one or multiple semiconductor processing steps. In some embodiments, the optical element 212 may be manufactured using photolithography techniques, pattern transfer techniques, imprinting techniques, or combinations thereof. The optical element 212 may be manufactured with a spin liquid deposited on the wafer/substrate 204. Non-limiting examples of materials that can be used for the optical element (and possibly the support structure(s) 216 as well) include an epoxy-based negative photoresist (e.g., SU8), poly(methyl methacrylate) (PMMA), bisbenzocyclobutene (BCB), polyamide, or KMPR®. The light-receiving surface of the optical element 212 may also be provided with an anti-reflective coating to help minimize the reflection of light therefrom.

The shape or geometry of the optical element 212 is subject to many possible design modifications. In the embodiment of FIG. 2, the optical element 212 exhibits a substantially frustroconical shape. More specifically, the optical element 212 is shown as an inversed truncated cone where the diameter of the inverted cone at the light-receiving surface is larger than the diameter of the inverted cone at the interface with photodetector 208. The optical element 212 is shown to fit within the metal traces/rings 224, 228 that surround the photodetector 208. It should be appreciated that such a configuration is not limiting, but rather the optical element 212 may be partially formed on top of the metal traces/rings 224, 228 without departing from the scope of the present disclosure.

With reference now to FIGS. 3A-5E, additional details of an illustrative optical sensing device will be described in accordance with at least some embodiments of the present disclosure. The optical sensing device shown in FIGS. 3A-5E may correspond to a more specific example of the optical sensing device 200 shown in FIG. 2.

Figure 4:
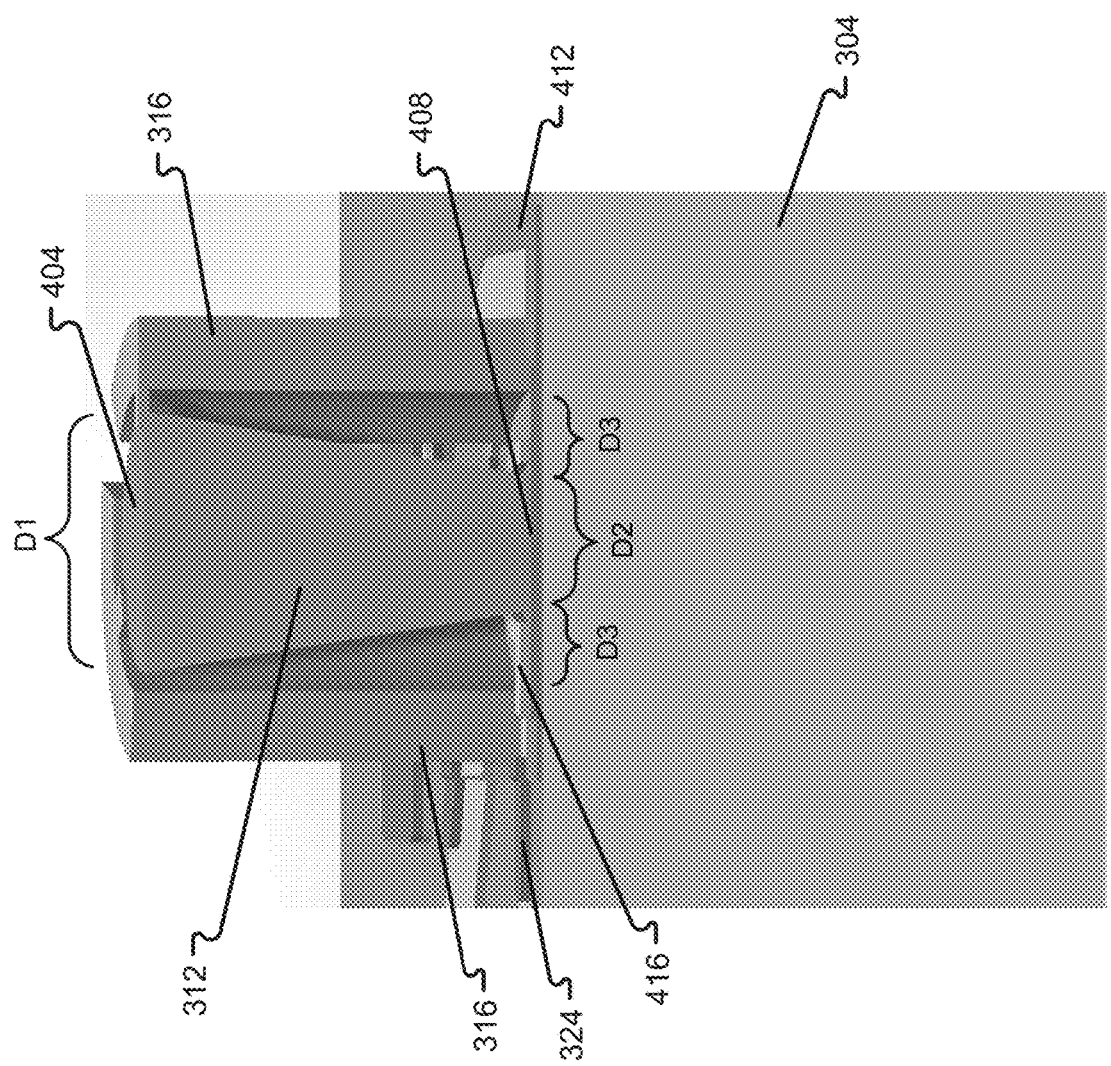
FIG. 4 is a detailed cross-sectional view of the optical sensing device of FIG. 3A.

As shown in FIGS. 3A, 3B, and 4, the optical sensing device comprises a substrate 304 having a top surface 308 on which additional elements are formed. The elements formed on the top surface 308 of the substrate 304 include, without limitation, an optical element 312, multiple support structures 316, metal traces 320, and metal bonding pads 324. The substrate 304 may be similar or identical to substrate 204. Although not shown in detail, the substrate 304 may have a photodetector area formed at the top surface 308 positioned underneath the optical element 312. The optical element 312 may be similar or identical to optical element 212. The support structures 316 may correspond to examples of support structures 216. The top metal traces 320 may correspond to examples of traces/rings 224, 228. The top metal pads 324 may correspond to examples of metal pads 220, 232.

FIG. 4 shows a detailed cross-sectional view of the optical sensing device's construction. In particular, FIG. 4 shows that a top light-receiving surface 404 of the optical element 312 has a larger cross-sectional area than a bottom surface 408 of the optical element 312. More specifically, because of the truncated cone structure used for optical element 312, the top surface 404 of the optical element 312 has a first diameter D1, which is larger than a second diameter D2 of the bottom surface 408 of the optical element 312. In some embodiments, the second diameter D2 substantially coincides with or matches a diameter of the photodetector on the substrate 304. The second diameter D2 also matches an inner diameter of the metal trace 416 that forms a ring around the photodetector. The first diameter D1, in some embodiments, may substantially match a diameter of an optical fiber that is used to carry an optical signal 120 to the optical element 312. In other embodiments, to accommodate manufacturing tolerances, the combined area of the top surface 404 of the optical element 312 and the top surfaces of the support structures 316 may be substantially equal to an area of an optical fiber that is proximate to the optical element 312. Such a configuration allows for minor misalignment between the optical fiber and the optical element. While it may be desirable to have the optical fiber be substantially coaxially aligned with the optical element 312, such a requirement may be relaxed when the light-receiving surface of optical element 312 is slightly smaller than the optical fiber.

The illustrative embodiment shows a configuration where the support structures 316 are separate components that support the optical element 312. The support structures 316 are shown to have substantially vertical side walls to further enhance their mechanical strength. It should be appreciated that the support structures 316 may alternatively be larger at their base, further contributing to their mechanical stability. As will be discussed in further detail herein, other embodiments of the present disclosure contemplate that the support structure(s) can be integral with the optical element.

Because the optical element 312 is shown as an inverted truncated cone and the support structures 316 are shown as substantially vertical structures, there is a gap having a width D3 between a base of the support structure 316 and the bottom surface 408 of the optical element 312. The size of this gap may decrease toward the top surface 404 of the optical element 312 to the point where the optical element 312 contacts the support structures 316 at their very top.

The optical sensing device is also shown to have an epitaxial layer 412 formed on the top surface 308 of the substrate 304. The epitaxial layer 412, may correspond to a crystalline overlayer grown or deposited on the top surface 308 of the substrate 304. In some embodiments, the epitaxial layer 412 resides between the top surface 308 of the substrate 304 and the other components formed on the substrate 304 (e.g., optical element 312, support structures 316, metal trace(s) 320/416, metal pads 324). The epitaxial layer 412 may be grown or formed on the substrate 304 using metal organic chemical vapor deposition (MOCVD) and/or molecular beam epitaxy (MBE).

Figure 5A:
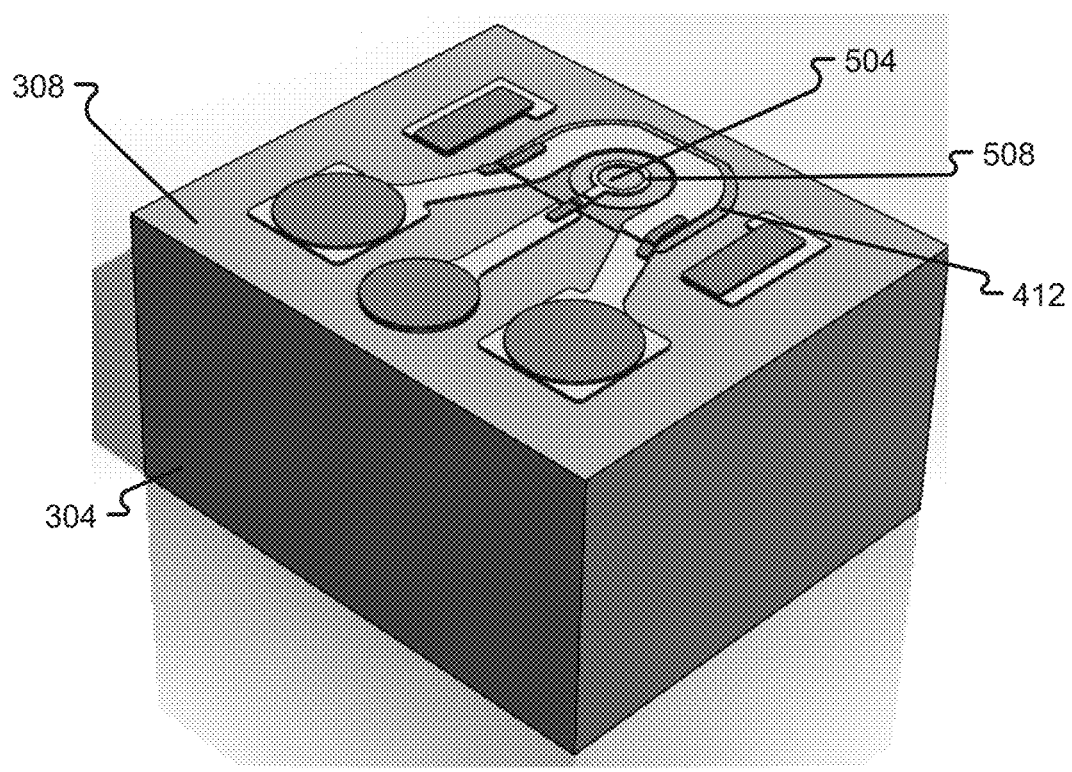
FIG. 5A is an isometric view of an optical sensing device at a first step of manufacture in accordance with at least some embodiments of the present disclosure.
Figure 5B:
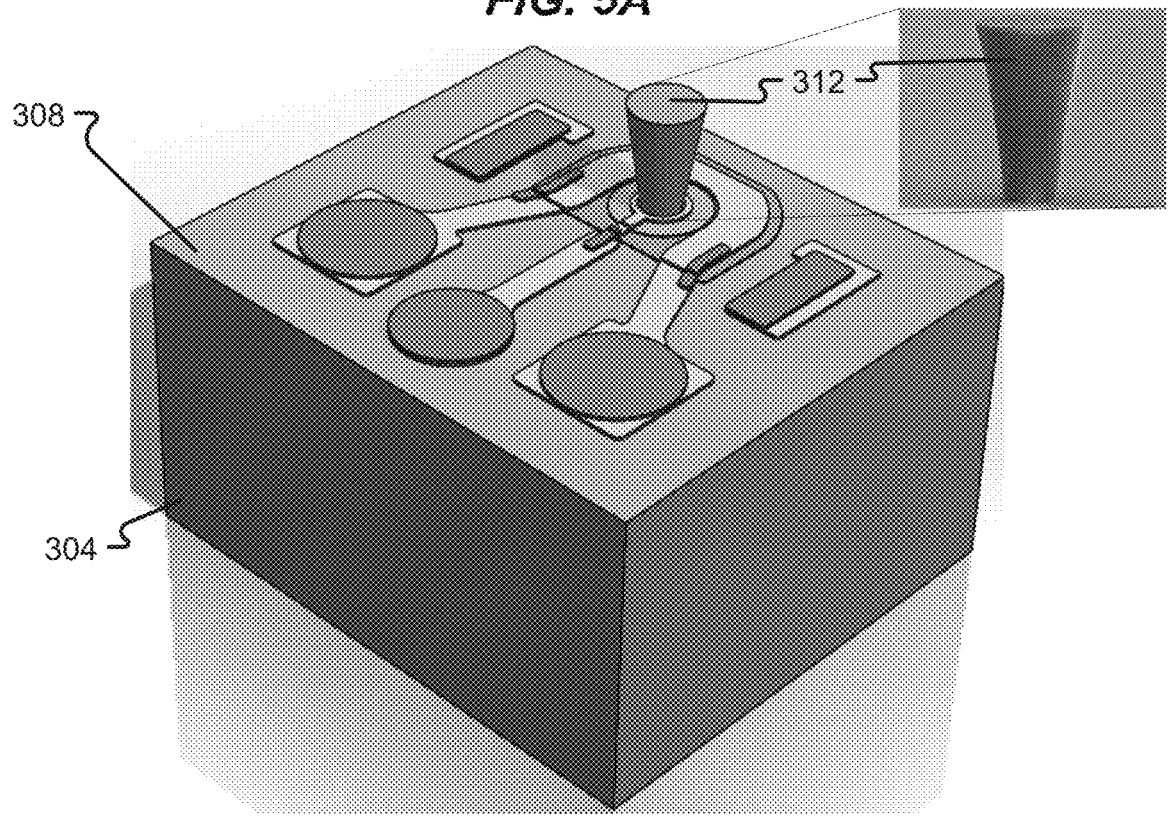
FIG. 5B is an isometric view of an optical sensing device at a second step of manufacture in accordance with at least some embodiments of the present disclosure.

As can be seen in FIG. 5A, the substrate 304 comprises a light detection area 504, which may correspond to the area of the photodetector 208 exposed at the top surface 308 of the substrate 304. The light detection area 504 may be surrounded by the metal trace/ring 508, which can be a specific formation of a metal trace 320. FIG. 5A also shows a more specific configuration of the epitaxial layer 412 on the top surface 308 of the substrate 304.

As described herein, the optical element 312 may be formed to substantially and entirely cover the light detection area 504. In this way, the only light that reaches the light detection area 504 may correspond to light which has passed through the optical element 312.

In some embodiments, the optical element 312 and support structure(s) 316 may be collectively referred to as a light guide system 512. The light guide system 512 may have a number of different configurations without departing from the scope of the present disclosure. Specifically, modifications to the geometry or design of the optical element 312 and/or support structure(s) 316 can be provided, thereby achieving different configurations for the light guide system 512. FIG. 5C depicts a final construction of an optical sensing device where the light guide system 512 has a first configuration of three support structures 316.

Additional details of this configuration for a light guide system 512 are depicted in FIG. 5D, which shows the support structures 316 as having at least one mating feature 516 on their inner wall and a substantially cylindrical outer surface 520. FIG. 5D also shows the light guide system 512 as having the support structures 316 being slightly taller than the optical element 312. The mating features 516 provide further mechanical stability to the optical element 312. Specifically, the mating features 516 may interface with corresponding receiving features on the optical element 312. These mating features 516 help to minimize the contact area between the optical element 312 and support structure 316 (e.g., to minimize light losses) while still providing the desired mechanical support for the optical element 312.

FIG. 5E depicts another possible configuration for a light guide system 512 in which the support structures 512 have a substantially rounded support interface 524. The shape of the support interface 524 may substantially match the shape of the outer surface 520 of the support structure 316. In this configuration, the support interface 524 creates a larger contact area between the optical element 312 and support structures 316, thereby resulting in further mechanical stability for the light guide system 512. Other modifications to the size/shape of the support structures 316 and/or optical element 312 may be made without departing from the scope of the present disclosure.

With reference now to FIGS. 6A-10, other possible configurations for a light guide system, optical element, and/or support structures will be described in accordance with at least some embodiments of the present disclosure. In particular, support structures that are integral with the optical element used to carry light from a light source to the photodetector will be described. It should be appreciated that features described in connection with these configurations can be utilized in connection with any of the other possible configurations of optical elements or support structures described herein.

Figure 6A:
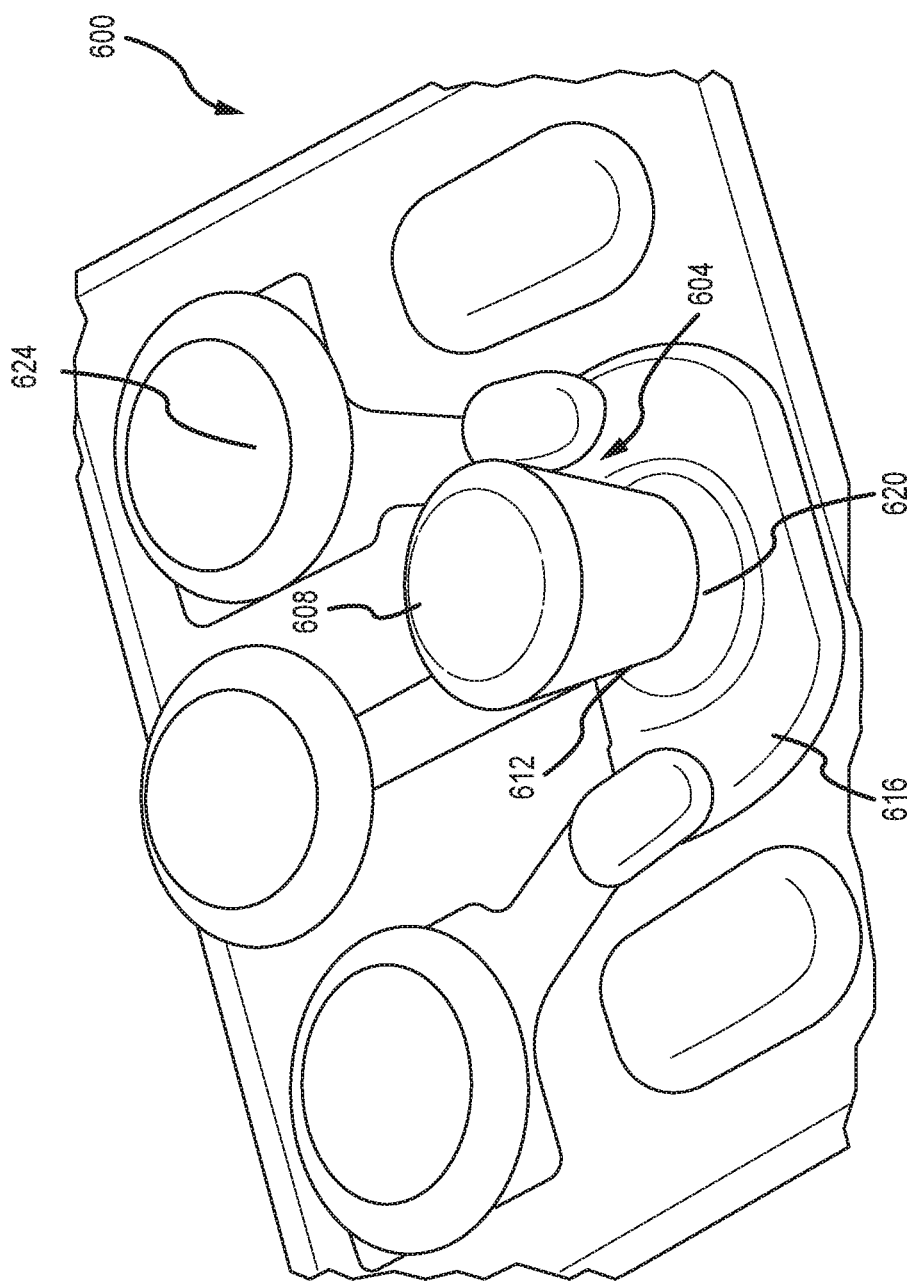
FIG. 6A is an isometric view of another illustrative optical sensing device in accordance with at least some embodiments of the present disclosure.

FIGS. 6A and 6B depict an illustrative optical sensing device 600 having an optical element 604 manufactured at the wafer level with other components of the device. In particular, the optical element 604 is shown to have a light-receiving surface 608 and an outer wall 612 that is substantially continuous. The optical sensing device 600 is also shown to include a metal trace 616, a metal trace ring 620, and a plurality of metal pads 624 positioned away from the photodetector area of the substrate and optical element 604. The optical element 624 is shown to have a substantially dome-shaped light-receiving surface 608. The particular shape of the light-receiving surface 608 may help facilitate the focusing/directing of incident light toward the photodetector of the substrate. As with the other optical elements described herein, the light-receiving surface 608 of the optical element 624 may be larger in area than the interface between the optical element 604 and the photodetector of the substrate. Such a configuration can help improve the optical performance of the optical sensing device 600 by effectively increasing the area of the photodetector without taking up additional space on the top surface of the substrate (e.g., without actually increase the size of the photodetector area). As a non-limiting example, the size of the photodetector area on the substrate may be approximately 27 um to 30 um in diameter (~572 um$^2$ to 706 um$^2$ in area) whereas the size of the optical element 604 at its largest diameter may be approximately 50 um to 55 um (~1962 um$^2$ to 2374 um$^2$ in area). Accordingly, the photodetector receives light from an area (e.g., the area of the light-receiving surface 608) over three times the area of the photodetector itself.

As can be seen in FIG. 6B, the optical element 604 may be constructed at the wafer level, meaning that a plurality of optical sensing devices 600 can be manufactured simultaneously on a larger wafer. After construction of the plurality of optical sensing devices 600, the wafer may be die cut to create the individual optical sensing devices 600 described herein.

Additional details of methods that may be used to construct the optical sensing devices at the wafer level will be described in connection with FIGS. 7, 8, and 9. With reference initially to FIG. 7, a first method 700 of manufacturing a plurality of optical sensing devices at substantially the same time will be described in accordance with at least some embodiments of the present disclosure. The method 700 begins when a substrate 716 has a first spin coat layer 720 provided thereon (step S701). In this step, a first photomask 724 may be used to control exposure of the layer 720. In some embodiments, the substrate 716 already has a plurality of photodetector areas (e.g., P-I-N diodes) formed on the top surface thereof. The size of the photodetector areas formed on the substrate 716 may be similar or identical to the size of gaps in the first photomask 724. Specifically, the first photomask 724 may comprise openings of a diameter that coincides with a diameter of the photodetector area. After exposure to curing light, the first photomask 724 is removed and then the uncured spin coat layer 720 is also removed from the substrate 716, thereby resulting in the formation of pillars 704 (step S702).

In some embodiments, the pillars 704 first formed on the substrate 716 are substantially cylindrical and comprise a diameter that is substantially equal to a diameter of the photodetector areas on the substrate 716. The method 700 continues with the application of an overlay material 728 over the substrate 716 and pillars 704 (step S703). The material used for the overlay material 728 may be similar or identical to the material used in first spin coat layer 720 (e.g., an epoxy-based negative photoresist (e.g., SU8), PMMA, BCB, polyamide, or KMPR®). Also in this step, a second photomask 732 is positioned over the substrate 716 and overlay material 728. The second photomask 732 may have openings much like the first photomask 724, but the openings of the second photomask 732 may be slightly larger in diameter than the openings of the first photomask 724. The overlay material 728 is then exposed to curing light through the second photomask 732 and the uncured overlay material 728 is removed, thereby resulting in the creation of an intermediate formation 708 (step S704). As can be seen in FIG. 7, the intermediate formation 708 begins to exhibit a frustroconical or muffin-top shape rather than the cylindrical shape of the pillar 704. This is because the overlay material 728 on top of the pillar 704 was cured whereas overlay material 728 closer to the substrate 716 was not cured.

The method proceeds with application of an additional overlay material 736 over the intermediate formation 708 and substrate 716 (step S705). A third photomask 740 is then positioned over the intermediate formations 708. The third photomask 740 may have openings that are larger than openings of the second photomask 732 or first photomask 724. The larger openings of the third photomask 740 result in more of the additional overlay material 736 being exposed to the curing light. Once exposed to the curing light, the third photomask 740 may be removed and the non-cured additional overlay material 736 may be removed from the substrate 716 (step S706). It should be appreciated that steps S705 and S706 may be repeated multiple times with progressively larger photomasks 740. Repeating steps S705 and S706 may help to further expand the light-receiving surface 608 of the optical element 604 until a final formation 712 is created on the substrate 716 over the photodetectors of the substrate.

After the optical elements 604 have been formed to the final formation 712, the method 700 may include a final step of singulating the wafer into a plurality of chips, each of which may be considered an optical sensing device.

Figure 8:
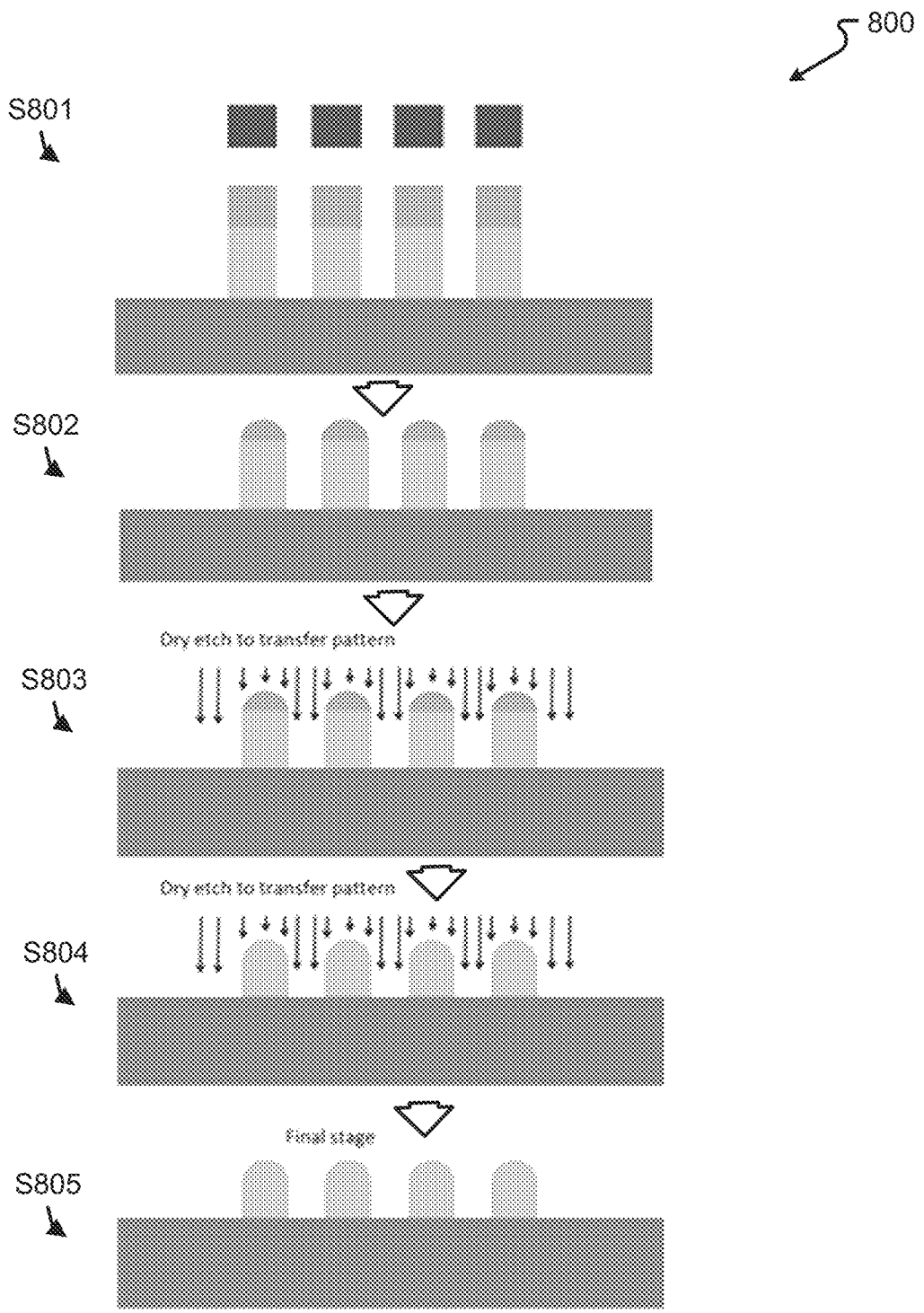
FIG. 8 is a flow diagram depicting a series of steps used in a second method of manufacturing an optical sensing device in accordance with at least some embodiments of the present disclosure.

FIG. 8 depicts another method 800 that can be used to produce an optical sensing device as described herein. The method 800 includes a step where a photomask is positioned over pillars of a spin coat layer that further have a resist formed on top thereof (step S801). A photolithography process may be used to form the pillar using material similar or identical to that used for the spin coat layer 720 (e.g., SUB, PMMA, BCB, polyamide, or KMPR®). The resist formed on top of the pillar may then be reflowed (step S802). Thereafter, the pillar with the reflowed resist may be dry etched to transfer the resist dot shape onto the pillar (step S803). This step may be performed multiple times (step S804). Thereafter, an antireflective coating may be applied to the pillars (e.g., before and/or after the lens formation)

(step S805). When in the final stage, the wafer may be singulated to create multiple chips or optical sensing devices.

Figure 9:
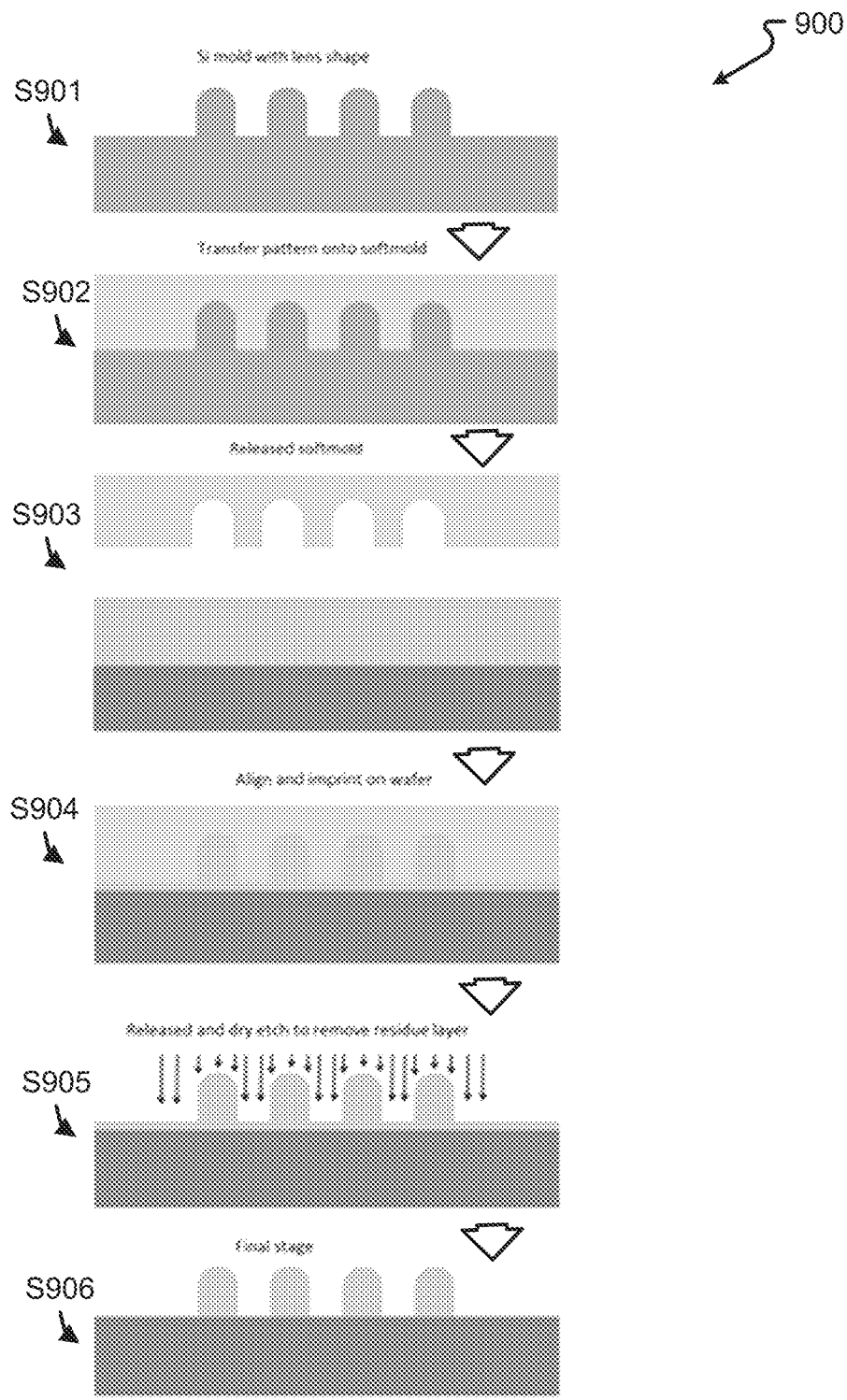
FIG. 9 is a flow diagram depicting a series of steps used in a third method of manufacturing an optical sensing device in accordance with at least some embodiments of the present disclosure.

With reference now to FIG. 9, yet another method 900 of producing an optical sensing device will be described in accordance with at least some embodiments of the present disclosure. The method 900 begins with the production of a mold having a desired lens shape for the optical elements (step S901). The method proceeds by transferring the pattern of the mold to a softmold (step S902).

The softmold is then released and aligned with a wafer having a moldable material thereon (step S903). In some embodiments, the wafer comprises a material thereon that is similar or identical to the spin coat layer 720. The cavities in the softmold may be aligned with the photodetector areas on the wafer (to try and imprint the moldable material directly over the photodetector area) (step S904). The softmold is then released and the remaining moldable material is dry etched to remove any remaining residue (step S905). Finally, antireflective coatings or other finishing treatments may be applied to the wafer and the optical elements formed thereon (step S906). The wafer may then be singulated to produce a plurality of optical sensing devices.

Figure 10:
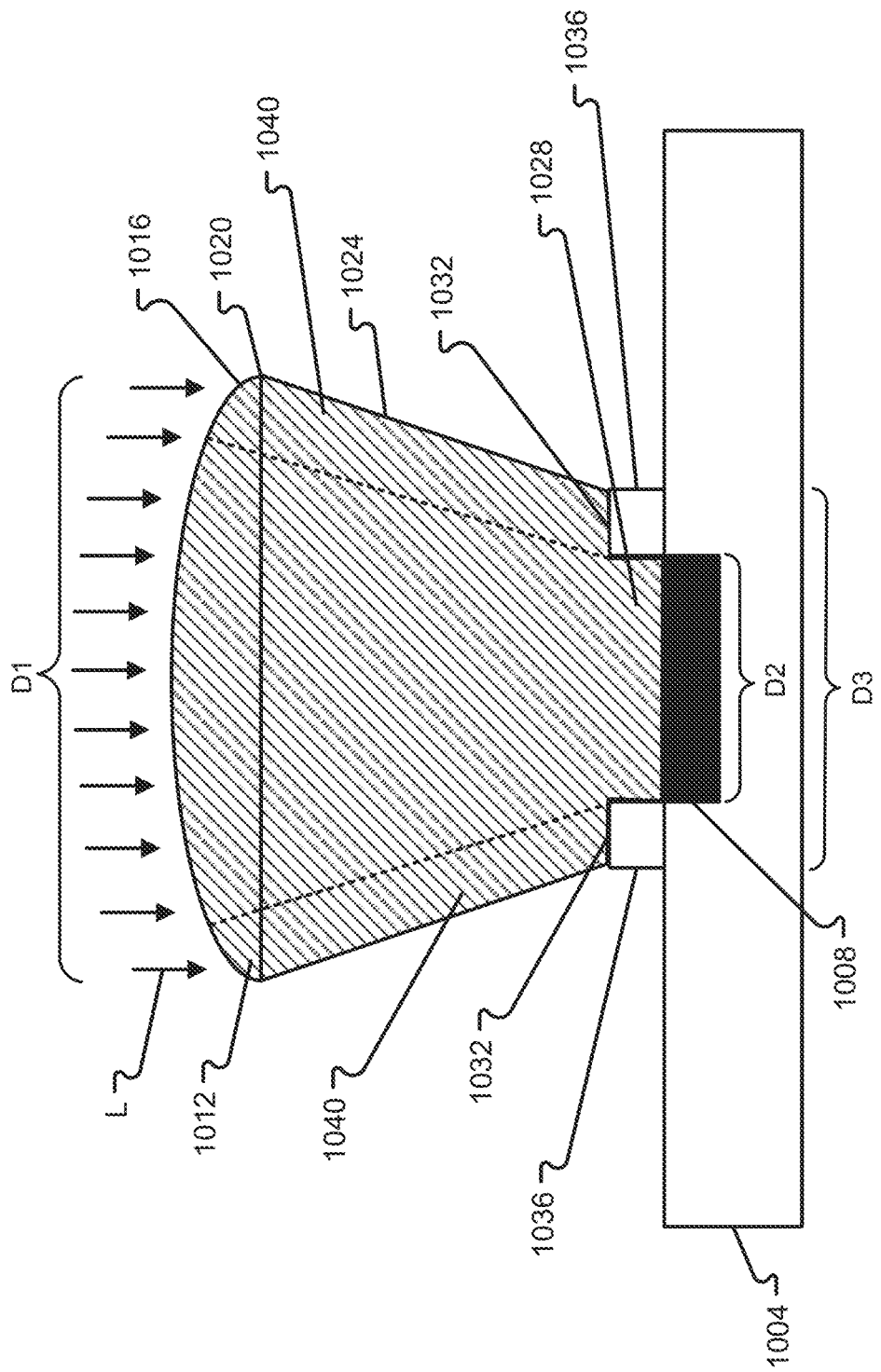
FIG. 10 is a block diagram depicting another optical sensing device in accordance with at least some embodiments of the present disclosure.

With reference now to FIG. 10, a cross-sectional view of an optical sensing device will be described in accordance with at least some embodiments of the present disclosure. The optical sensing device depicted in FIG. 10 may be similar or identical to the optical sensing device 600. In particular, the optical element 1012 of the optical sensing device may comprise a substantial muffin-top shape (e.g., an inverted truncated cone with a top curved surface 1016).

Similar to other optical sensing devices described herein, the optical sensing device of FIG. 10 is shown to include a substrate 1004 and a photodetector 1008. The photodetector 1008 is formed on the top surface of the substrate 1004 such that the light-receiving area of the photodetector is co-planar with the top surface of the substrate 1004.

The photodetector 1008 is surrounded by a ring 1036, which may be formed of a metal material that partially or completely surrounds the photodetector 1008. The ring 1036 may create a raised structure relative to the photodetector 1008. The optical element 1012 is shown to be positioned over the photodetector 1008 in such a way that the optical element 1012 is substantially centered with respect to the photodetector 1008.

The optical element 1012 may be constructed of material similar to other optical elements described herein. Specifically, the optical element 1012 may comprise an optically transparent material that functions to carry light L incident on its top curved surface 1016 toward the photodetector 1008 (much like a light guide). This particular optical element 1012 is not supported by separate support structures. Rather, optical element 1012 comprises an integral support structure portion 1040 and a light guide portion 1028. The light guide portion 1028 and integral support structure portion 1040 may be manufactured from the same material and may, in fact, not have any discontinuities of material from one portion to the next (even though an illustrative dotted line is shown as separating the two portions in FIG. 10). Said another way, the entirety of the optical element 1012 (including its various portions) may be a monolithic structure. However, the support structure portion 1040 is provided as a mechanical support feature whereas the light guide portion 1028 is provided as a portion of the optical element 1012 that carries light L down to the photodetector 1008. Light L that is incident on the support structure portion 1040 may still be carried by the optical element 1012, but that particular portion of light may not ultimately reach the photodetector 1008. Instead, light carried by the support structure portion 1040 may impact the ring 1036 and reflect back into the optical element 1012 or be absorbed by the ring 1036.

In some embodiments, the support structure portion 1040 corresponds to additional material added to the optical element 1012 for the purposes of enabling the optical element 1012 to be structurally self-supporting. The support structure portion 1040 may comprise a support base 1032 that is partially or entirely formed on top of the ring 1036. The interface between the support structure portion 1040 and ring 1036 may serve to physically stabilize the optical element 1012. Said another way, the support structure portion 1040 may be portions not meant for optically transmit light but mere additional portion to provide physical support to stabilize the optical element 1012.

The optical element 1012 is also different from certain other optical elements described herein because of the top curved surface 1016 of the optical element 1012. The top curved surface 1016 may correspond to the light-receiving surface of the optical element and may help to focus light L toward the photodetector 1008. The optical element 1012 also exhibits an outer wall 1024 that connects with the top curved surface 1016 via a transition edge 1020. The transition edge 1020 may correspond to the widest part of the optical element 1012 with a first diameter D1. The first diameter D1 may be larger than the diameter of the light guide portion 1028 that interfaces with the photodetector 1008, which is shown as a second diameter D2. The optical element 1012 also exhibits a third diameter D3, which is larger than the second diameter D2, but smaller than the first diameter D2. The third diameter D3 may correspond to a diameter of the optical element 1012 at its interface with the rings 1036. This third diameter D3 may be substantially equal to the outer diameter of the rings 1036, although such a configuration is not required. In fact, the third diameter D3 may be larger or smaller than the outer diameter of the ring 1036.

Although not depicted, the optical sensing device of FIG. 10 may also have one or more top metal pads that are separated from the photodetector 1008 and from the optical element 1012. The metal pads may carry current from the photodetector 1008 and provide an interface for wirebonding or the like.

Furthermore, although FIG. 10 depicts the outer wall 1024 as being substantially linear, it should be appreciated that the outer wall 1024 can be curved as shown in connection with optical sensing device 600.

A number of different optical sensing devices have been depicted and described herein. Aspects of the present disclosure contemplate an optical sensing device comprising: a semiconductor die having a photodetector; an optical element optically coupled to and disposed on the photodetector; at least one support structure substantially surrounding the optical element, wherein a portion of the at least one support structure is in direct contact with a portion of the optical element to provide structural support thereto; and a top metal pad disposed on the semiconductor die adjacent to but distanced away from the optical element and the at least one support structure.

Additional aspects of the present disclosure contemplate that the optical element includes an inverted truncated conical shape light guide.

Aspects of the present disclosure also contemplate that the optical element include a top surface and a bottom surface, were the top surface has a larger diameter relative to the bottom surface and is configured to receive and direct light to the photodetector. In some embodiments, the bottom surface of the optical element is aligned with the photodetector. In some embodiments, the bottom surface of the optical element includes a bottom optical surface area which is substantially similar to a top area of the photodetector.

Aspects of the present disclosure also contemplate that the semiconductor die includes a dielectric layer sandwiched between the optical element and the photodetector.

Aspects of the present disclosure also contemplate that the at least one support structure includes an inner surface facing the optical element, and the inner surface of the at least one support structure includes a shape which complements an outer shape of the optical element.

Aspects of the present disclosure also contemplate that the at least one support structure is in direct contact with a top portion of the optical element.

Aspects of the present disclosure also contemplate that the at least one support structure includes at least first and second support structures. The at least first and second support structures may each include an inner surface facing the optical element. The inner surface of the first and second support structures may also include a shape which complements an outer shape of the optical element. The at least first and second support structures may be in direct contact with a top portion of the optical element. Furthermore, the at least first and second support structures can be arranged in a circular manner which is co-axially aligned with the optical element.

Aspects of the present disclosure also contemplate that a top surface of the optical element includes an outer perimeter, and that the at least one support structure is in direct contact with the outer perimeter of the optical element.

Aspects of the present disclosure also contemplate that the at least one support structure includes at least one overhang portion which is in direct contact with and overlaps a top surface of the optical element. In some embodiments, the at least one overhang portion overlaps about less than 20% of the top surface of the optical element.

Aspects of the present disclosure also contemplate that the at least one support structure includes at least one extension portion which is in direct contact with an outer perimeter the optical element. In some embodiments, top surfaces of the at least one extension portion and the optical element are substantially coplanar with each other.

Aspects of the present disclosure also contemplate that the at least one support structure includes at least one void area, and wherein the at least one support structure in combination with the at least one void area completely surround the optical element. In some embodiments, the top metal portion comprises a center portion which extends into the void area.

Aspects of the present disclosure also contemplate that the top metal portion includes a plurality of contact pads, a first top metal layer portion, a second top metal layer portion, and wherein the first and second top metal layer portions are arranged and configured to distribute the weight across the semiconductor die. In some embodiments, the first and second top metal layer portions are arranged sandwiching the optical element on the semiconductor die. In some embodiments, the first and second top metal layer portions and the optical element are arranged along a first axis on the semiconductor die while the plurality of contact pads are arranged substantially along a second axis on the semiconductor die, and the first axis is parallel to the second axis.

Aspects of the present disclosure also contemplate that the at least one support structure comprises a photosensitive material.

Aspects of the present disclosure also contemplate that the optical element and the at least one support structure comprise the same material.

Aspects of the present disclosure also contemplate that the sensing device is a chip-scale sensing device.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A sensing device for detecting light, the sensing device comprising:
    a semiconductor die having a photodetector, wherein the photodetector includes an exposed area on a surface of the semiconductor die;
    a substantially transparent material coupled to and disposed on the photodetector, wherein the substantially transparent material provides a light guide function and is physically supported by a support structure, wherein the substantially transparent material directs light incident on a light-receiving surface of the substantially transparent material towards the exposed area of the photodetector, wherein the support structure is at least partially overlapping an area of the semiconductor die other than the photodetector, and wherein a void area exists between a base of the support structure and a bottom surface of the substantially transparent material; and
    a top metal pad disposed on the semiconductor die adjacent to but distanced away from the substantially transparent material.

2. The sensing device of claim 1, wherein the light-receiving surface of the substantially transparent material comprises a top surface.

3. The sensing device of claim 2, wherein the top surface directs light incident thereon toward the photodetector.

4. The sensing device of claim 2, wherein a width of the void area between the support structure and the substantially transparent material decreases toward the top surface of the substantially transparent material.

5. The sensing device of claim 4, wherein the support structure corresponds to an outer portion of the substantially transparent material that interfaces with a metal trace that surrounds the exposed area.

6. The sensing device of claim 4, wherein light that travels through the support structure is directed beyond the exposed area.

7. The sensing device of claim 1, wherein the support structure is separate from the substantially transparent material.

8. The sensing device of claim 7, wherein the support structure comprises a plurality of discrete support structures that surround the substantially transparent material and that interface with some but not all portions of the substantially transparent material at the light-receiving surface of the substantially transparent material.

9. The sensing device of claim 1, wherein the substantially transparent material comprises a light guide shaped as an inverted truncated cone.

10. The sensing device of claim 1, wherein a diameter of the light-receiving surface of the substantially transparent material is larger than a diameter of a bottom surface of the substantially transparent material that interfaces with the photodetector.

11. The sensing device of claim 1, wherein the semiconductor die comprises a dielectric layer positioned between the substantially transparent material and the photodetector.

12. The sensing device of claim 1, wherein the substantially transparent material and the support structure comprise a photosensitive material.

13. The sensing device of claim 1, wherein the substantially transparent material and the support structure are constructed of a common material.

14. An optical system, comprising:
an optical sensing device configured to convert light signal into an electrical signal, the optical sensing device comprising:
a substrate having a light detection area provided thereon, the light detection area having a top surface that is coincident with a top surface of the substrate;
a light guide system that includes an optical element and a support structure, wherein the optical element is configured to carry the light signal to the light detection area, wherein the support structure physically supports the optical element and is positioned at least partially outside the light detection area, and wherein a void area exists between a base of the support structure and a bottom surface of the optical element; and
a top metal pad disposed on the top surface of the substrate that is adjacent to but distanced away from the light guide system.

15. The optical system of claim 14, further comprising:
a microprocessor configured to receive the electrical signal from the optical sensing device.

16. The optical system of claim 15, wherein the microprocessor and the optical sensing device are provided in a communications transceiver.

17. The optical system of claim 14, wherein the light signal is received as substantially collimated light from an optical fiber.

18. The optical system of claim 14, wherein the support structure comprises a plurality of discrete elements.

19. The optical system of claim 14, wherein a width of the void between the support structure and the optical element decreases toward the top surface of the optical element.

20. An optical sensing device, comprising:
a semiconductor die having a top surface, wherein a photodetector is provided in the semiconductor die and has a light-receiving surface that is substantially co-planar with the top surface of the semiconductor die;
an optical element positioned substantially co-axially with respect to the photodetector, wherein the optical element comprises a top surface and an opposing bottom surface that is positioned proximate to the photodetector, wherein light incident on the top surface of the optical element is guided to the bottom surface of the optical element so that the light can be provided to the photodetector, and wherein the top surface of the optical element comprises an area that is larger than the bottom surface of the optical element;
one or more support structures that are physically supported by the top surface of the semiconductor die or a metal trace formed thereon, wherein the one or more support structures are positioned beyond the photodetector and provide structural support for the optical element, and wherein a void exists between a base of the one or more support structures and a bottom surface of the optical element; and
a metal pad formed on the top surface of the semiconductor die, wherein the metal pad is distanced away from the optical element.

* * * * *